US006901574B2

(12) United States Patent
LaCour et al.

(10) Patent No.: US 6,901,574 B2
(45) Date of Patent: May 31, 2005

(54) DATA MANAGEMENT METHOD FOR MASK WRITING

(76) Inventors: Patrick J. LaCour, 2112 Fleming Dr., McKinney, TX (US) 75070; Emile Sahouria, 1632 Willow Lake La., San Jose, CA (US) 95131; Siqiong You, 6420 El Paseo Dr., San Jose, CA (US) 95120

( * ) Notice: Subject to any disclaimer, the term of this patent is extended or adjusted under 35 U.S.C. 154(b) by 182 days.

(21) Appl. No.: 09/781,128

(22) Filed: Feb. 9, 2001

(65) Prior Publication Data

US 2002/0157068 A1 Oct. 24, 2002

(51) Int. Cl.[7] .......................... G06F 17/50; G06F 9/45; G06F 9/455; G03F 9/00; G03C 5/00
(52) U.S. Cl. .............................. 716/19; 716/5; 716/11; 716/21; 430/5; 430/30
(58) Field of Search .......................... 716/5, 11, 19–21; 430/5, 30

(56) References Cited

U.S. PATENT DOCUMENTS

| | | | | |
|---|---|---|---|---|
| 5,050,091 A | | 9/1991 | Rubin | |
| 5,551,014 A | * | 8/1996 | Yoshida et al. | 716/11 |
| 5,682,323 A | * | 10/1997 | Pasch et al. | 716/19 |
| 5,740,071 A | * | 4/1998 | Leipold | 716/11 |
| 5,879,844 A | * | 3/1999 | Yamamoto et al. | 430/30 |
| 5,995,734 A | * | 11/1999 | Saika | 716/9 |
| 6,275,604 B1 | * | 8/2001 | Miyajima et al. | 382/146 |
| 6,370,679 B1 | * | 4/2002 | Chang et al. | 716/19 |
| 6,416,907 B1 | * | 7/2002 | Winder et al. | 430/5 |
| 6,560,766 B2 | * | 5/2003 | Pierrat et al. | 716/19 |

* cited by examiner

*Primary Examiner*—A. M. Thompson
*Assistant Examiner*—Chris C. Chu
(74) *Attorney, Agent, or Firm*—Christensen O'Connor Johnson Kindness PLLC

(57) ABSTRACT

A method of translating device layout data to a format for a mask writing tool includes the acts of reading a file defining a number of cells that represent structures on the device. One or more cells are selected and one or more modified cells based on the interaction of the selected cells with other cells in the device layout are created. One or more additional cells is created that will create structures on the mask that are not formed by writing files corresponding to the modified cells and areas that prevent extraneous structures from being formed on the mask at a selected location by the writing of the files corresponding to the modified cells. A jobdeck for the mask writing tool is created that indicates where the files corresponding to modified cells and the one or more additional cells should be written to create one or more masks or reticles.

15 Claims, 7 Drawing Sheets

DATA MANAGEMENT METHOD FOR MASK WRITING

FIELD OF THE INVENTION

The present invention relates to photolithographic patterning, such as methods for creating photolithographic masks or reticles, and in particular, relates to data preparation methods for photolithographic masks or reticles.

BACKGROUND OF THE INVENTION

The vast majority of all complex integrated circuits (ICs) are created by circuit designers using computers. Most circuit designers use computer programs to define the functionality required of the circuit and the computer analyzes the functionality requested in order to create the electronic equivalent of a circuit diagram.

To convert the designers intent into a physical, integrated circuit, other computer programs take libraries of cells representing groups of transistors and other low level circuit components that provide the desired functionality, determine locations for these components, and construct the wiring necessary to interconnect them. Such a tool is often called a "place and route tool." Custom design tools also exist to provide other methods to craft complete IC layouts. Once all the electronic devices have a physical representation, it is expected that the physical circuit will deliver the specified electrical performance.

The layers of the layout data are then fabricated as a set of masks, used in the photolithographic definition and processing of the actual circuits themselves.

Before translating the IC layout data into a format for use by a photolithographic mask or reticle writing tool, the IC layout data is often analyzed by another computer program to ensure that no design rules have been broken during the creation of the IC layout data and/or to correct for errors that can occur during the photolithographic printing process.

One example of such a program is the Calibre™ program produced by Mentor Graphics Corporation of Wilsonville, Oreg., the assignee of the present application. The Calibre™ program is a suite of tools that operate on the IC layout data. These tools include a design rule checking (DRC) program that ensures the compliance with a number of design rules particular to the manufacturing process to be used. For example, a design rule can specify a particular tolerance such as "no transistors can be located within x microns of other transistors," etc. In addition, the Calibre™ program can perform optical process correction (OPC) to compensate the layout for distortions that occur during the printing of the photolithographic mask or reticle. In addition, Calibre™ can perform phase shift mask (PSM) modifications that add phase shifters to the mask or reticle in order to enhance contrast between features or add subresolution features on an integrated circuit.

The next step in preparing an integrated circuit is to translate the verified and/or corrected IC layout data into a format that can be utilized by a mask or reticle writing tool. Examples of such formats are MEBES, for raster scanning machines manufactured by ETEC, an Applied Materials Company, ".MIC" format from Micronics AB in Sweden for their mask writers, and various vector scan formats for Toshiba, JEOL, and Hitachi. Once written, the masks or reticles are then used in a photolithographic process to expose selected areas of a silicon wafer in order to produce the integrated circuit components on the wafer. Typical mask writing tool formats are flat, and computer files written in these formats containing the corrected IC layout data can be enormous. For example, one IC layout data file for a single layer of a field programmable gate array can be approximately 58 gigabytes long. The time required to transmit a file of this size to a mask or reticle writing tool with standard network protocols can exceed 60 hours. When such large files are transmitted over communication networks, the risk that an error will occur during transmission rises with the length of the file transmitted. In addition, the time required to transmit the data file can be longer than the time required for the mask or reticle writer to produce a mask or reticle from the file. Therefore, the mask writing tool is inefficiently used when the data files are too large.

Given these problems, there is a need for an improved method of translating data into a format that can be read by a photolithographic mask or reticle writing tool that will reduce the size of the file to be transmitted and reduce the likelihood of transmission errors.

SUMMARY OF THE INVENTION

The present invention is a method of reducing the amount of data that is transmitted to a mask or reticle writing tool to produce an IC or other device by a photolithographic process. A computer reads a file having a number of cells that completely define a layer of the device. One or more of these cells are selected and modified based on the interaction of the selected cells with other cells in the device layout. One or more additional or remainder cells are created that will produce structures on the mask not produced by the modified cells and will also prevent the formation of extraneous structures on the mask by the modified cells. The computer then creates a jobdeck for the mask or reticle writing tool that includes all the placements on the mask of the modified cells and the one or more additional cells. The jobdeck is created in a format that is readable by the mask or reticle writing tool. Once the description is complete, the jobdeck and the descriptions of the cells placed in the jobdeck are transmitted to the mask or reticle writing tool for execution. The data representation of the device layer using a jobdeck and cells is more compact than traditional flat formats for mask writing tools, yet also provides a complete set of instructions to produce the same mask.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

As indicated above, the present invention is a method and apparatus for creating a mask from IC layout data in a manner that reduces the amount of data that is transmitted to a mask writing tool, This is done by identifying certain cells that are repeated and eliminating redundant representations. To insure the entire chip is faithfully reconstructed, certain modifications are made to the cells as described below. Machine jobdeck formats then specify where the cells are to be placed on the mask to insure the complete layer is produced.

Although the present specification utilizes the term photolithographic "masks" and mask writing tools, it will be appreciated that the present invention is also applicable to systems that create photolithographic reticles, as well as for systems similar to mask writing systems that actually write patterns directly on wafers or other substrates. Therefore, as used herein, the term "mask" is intended to refer to both photolithographic masks and reticles as well as other structures that modulate lithographic exposure. Furthermore, although the present embodiment describes layout manipulations for production in a mask writing tool, it is clear that these same techniques can be applied to similar exposure systems that produce patterns on other substrates, such as semiconductor wafers or quartz waveguide substrates. In addition, although the present embodiment of the invention is described with respect to IC layout data, it will be appreciated that the techniques of the present invention are useful for producing other types of devices that require the use of photolithographic masks such as microelectromechanical systems (MEMS), thin film heads for magnetic recording, genechips for biological assays, etc.

Figure 1:
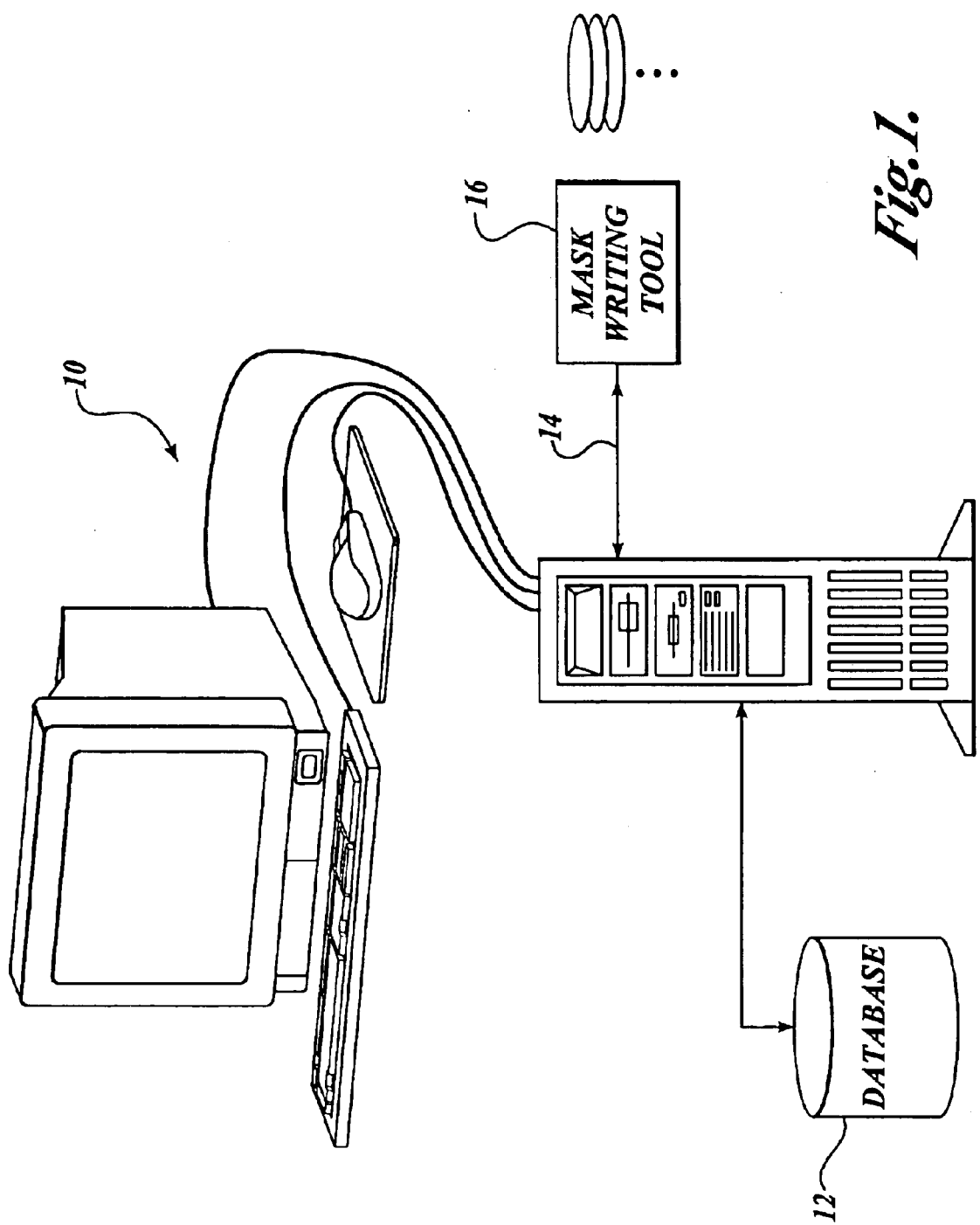
FIG. 1 illustrates a computer system used to create photolithographic masks in accordance with the present invention.

FIG. 1 illustrates a system for creating photolithographic masks in accordance with known methods and which can also be used in accordance with the present invention. A computer system 10 receives a file that contains the IC layout data and stores it in a database 12. In the presently preferred embodiment of the invention, the computer system 10 runs the Calibre™ program that stores the IC layout data in a hierarchical database. The Calibre™ program subjects the IC layout data to design rule checking (DRC), optical process control (OPC) and may add phase shift masks (PSM) to the IC layout data in order to ensure the manufacturability of the IC as well as to compensate for distortions that can occur as part of a photolithographic process. In practice, processing speed improvements can be achieved by using computers with multiple processors (multithreading), or by distributing the computation tasks among a network of computers.

Once the IC layout data has been verified, the data is translated to a suitable mask writing tool data format and transmitted via a communication link 14 to the mask writing tool 16. Typically, the communication link 14 is a dedicated computer link, a shared data communication link, such as a leased telephonic link, or a local or wide area network. As indicated above, the time required to transmit an IC layout from the computer system 10 to the mask writing tool 16 can be considerable.

The present invention seeks to reduce the amount of data that is transmitted from the computer system 10 to the mask writing tool 16, by taking advantage of jobdeck management capabilities of the mask writing tool. Many mask writing tools have the ability to write data for several integrated circuits on the same mask. Typically, a jobdeck is created to specify the sequence and placement of these various circuit layouts within the mask. Jobdecks also typically contain practical information for the mask writing tool, such as the writing beam spot size, the address unit, dose control information, etc. As will be described in further detail below, the present invention takes advantage of the jobdeck format or language to eliminate the need to transmit redundant IC layout data to the mask writing tool.

Figure 2A:
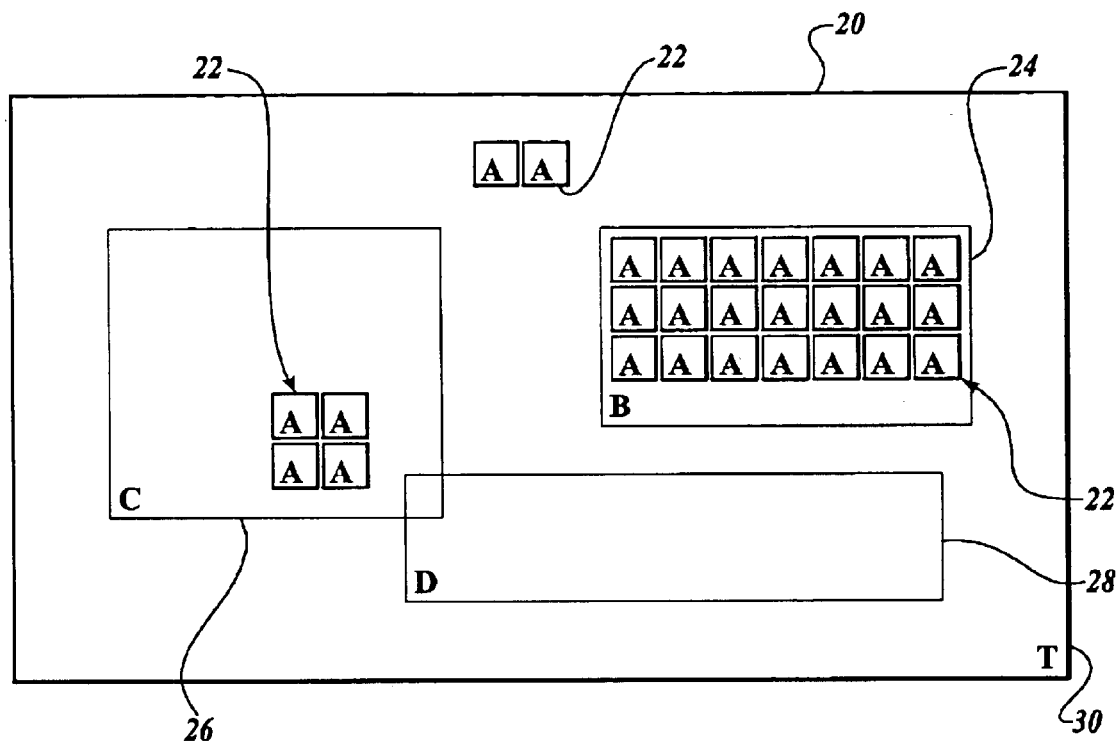
FIG. 2A is a simplified diagram of an IC layout including one or more cells having repeated patterns of polygons.

FIG. 2A illustrates an IC layout 20 having a number of cells. The IC layout 20 has a number of replicated cells A as indicated by the reference number 22, a cell B indicated by the reference number 24, a cell C as indicated by the reference number 26, a cell D as indicated by the reference number 28, and a top cell T as indicated by the reference number 30.

Figure 2B:
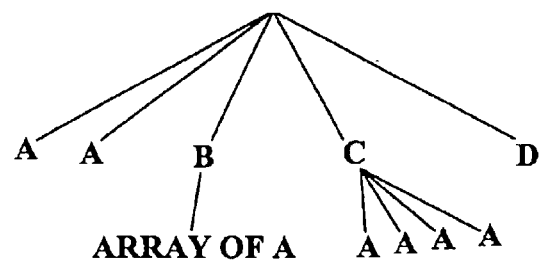
FIG. 2B illustrates a hierarchical structure of the cells that comprise the IC layout shown in FIG. 2A.

The IC layout shown in FIG. 2A can be represented as a hierarchical data structure as shown in FIG. 2B. The top cell T includes each of the cells A, B, C, and D. The cell B includes a 3×7 array of cells A and the cell C includes a 2×2 array of cells A. The Calibre™ program produced by Mentor Graphics stores IC layout data in a hierarchical data structure of the type shown in FIG. 2B. The hierarchical data structure is advantageous because complete descriptions of cells that are repeated in the IC layout do not need to be repeated in the database at every instance where the repeated cell occurs.

In conventional layout data preparation for mask creation, the IC layout data stored within a hierarchical database is "flattened" or compressed to a single layer. In a flattened file, a full description of a repeated cell is provided for each placement of the repeated cell and the descriptions are transmitted to the mask writing tool. As indicated above, flattened IC layout data files can be extremely large and time consuming to transmit.

Figure 3A:
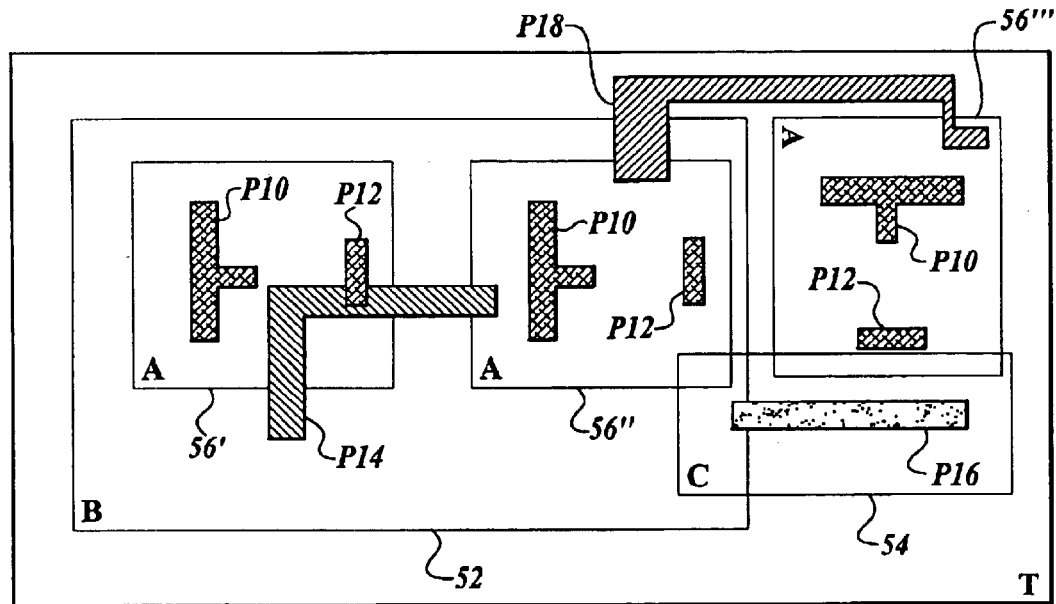
FIG. 3A is a simplified IC layout having a number of cells with repeating patterns of polygons.
Figure 3B:
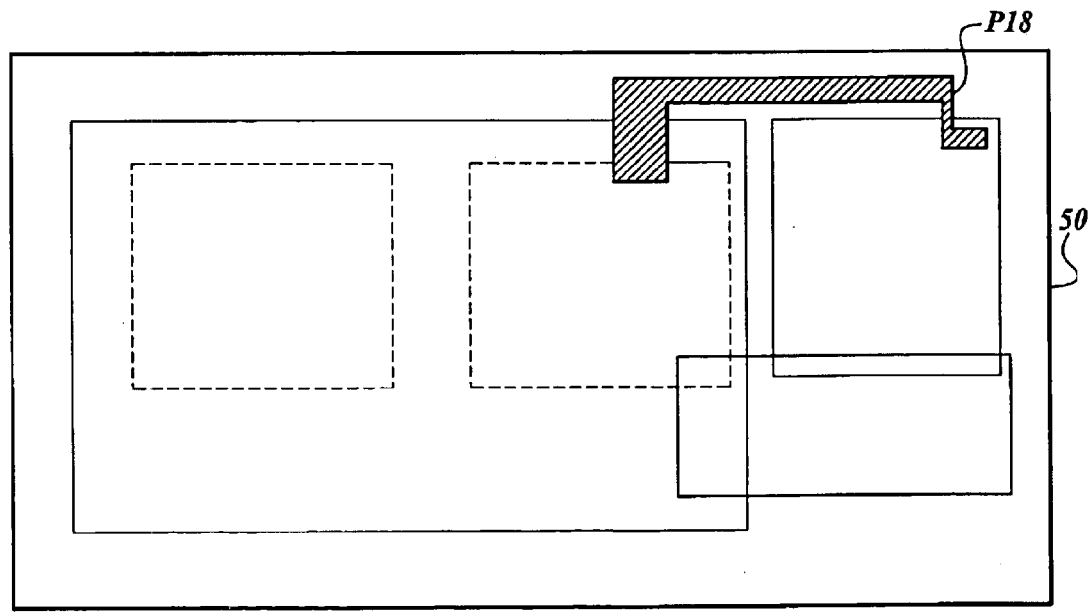
FIGS. 3B–3E illustrate the individual polygons within cells that comprise the IC layout shown in FIG. 3A.
Figure 3C:
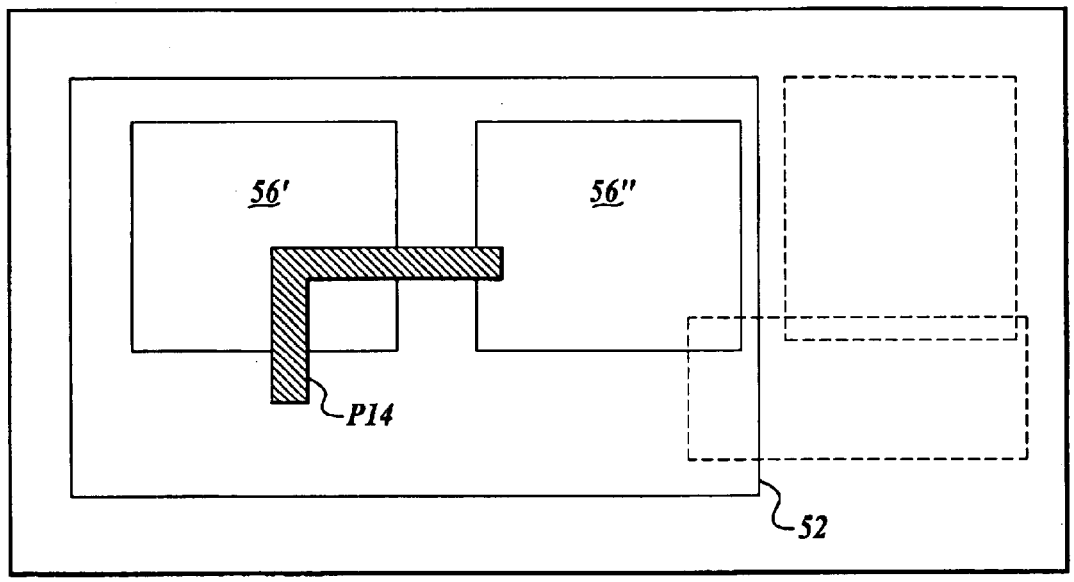
Figure 3D:
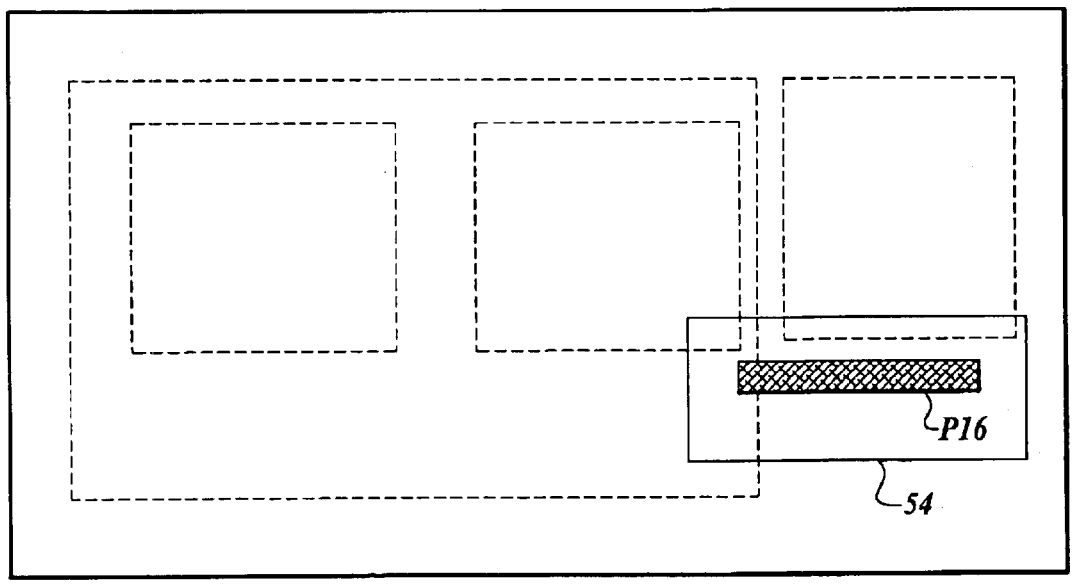
Figure 3E:
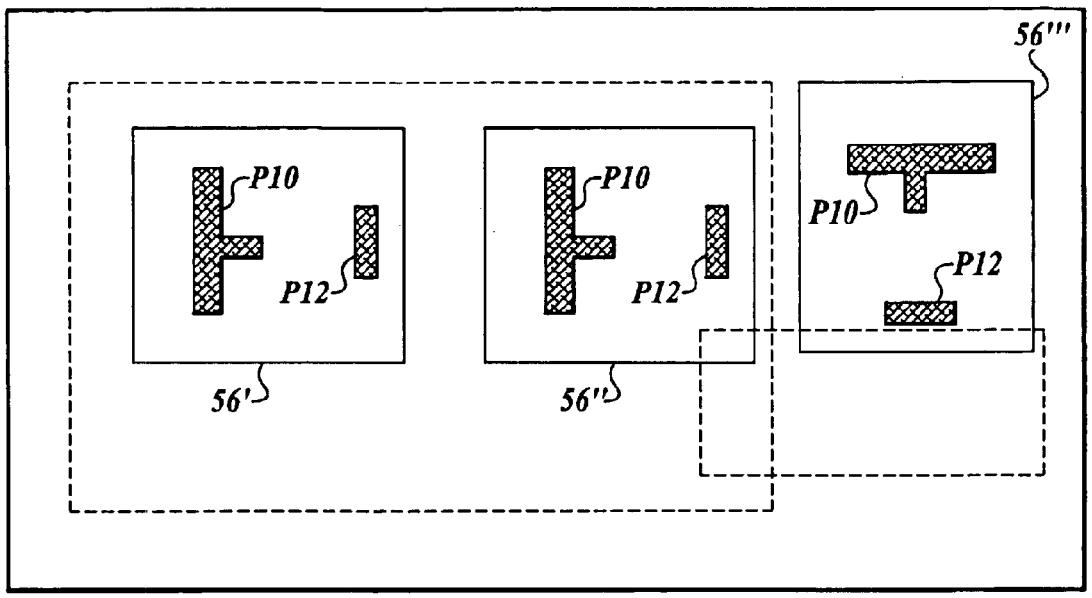
Figure 3F:
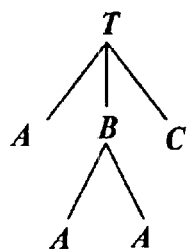
FIG. 3F illustrates a hierarchical structure of the cells that comprise the IC layout shown in FIG. 3A.

FIG. 3A shows a simplified layout that illustrates various aspects of the present invention. It will be appreciated by those skilled in the art that the polygons shown in the cells of the layout are for purposes of illustration and is not supposed to represent actual circuit components. The layout shown in FIG. 3A includes four cells, as illustrated by the hierarchy tree in FIG. 3F: a top cell T as indicated by the reference number 50, a cell B as indicated by the reference number 52, a cell C as indicated by reference number 54, and one instance of a cell A as represented by reference number 56'". In addition, cell B contains two instances of cell A as represented by reference numbers 56' and 56". As will be appreciated from FIG. 3A, the cell 56'" is rotated clockwise 90° with respect to the other instances 56' and 56" of the cell A.

Each of the cells includes one or more polygons that define desired structures on a photolithographic mask. The structures defined by a polygon can be an opaque chrome area surrounded by clear areas in the case of bright-field photolithographic masks. Alternatively, the polygons can define structures that are clear areas on the mask surrounded by opaque areas in the case of dark-field photolithographic masks.

Each instance 56', 56", and 56'" of all the A cells include two polygons P10 and P12. Cell B 52 has a single polygon P14. The cell C 54 has a single polygon P16 and the top cell T 50 has a single polygon P18.

Figure 4:
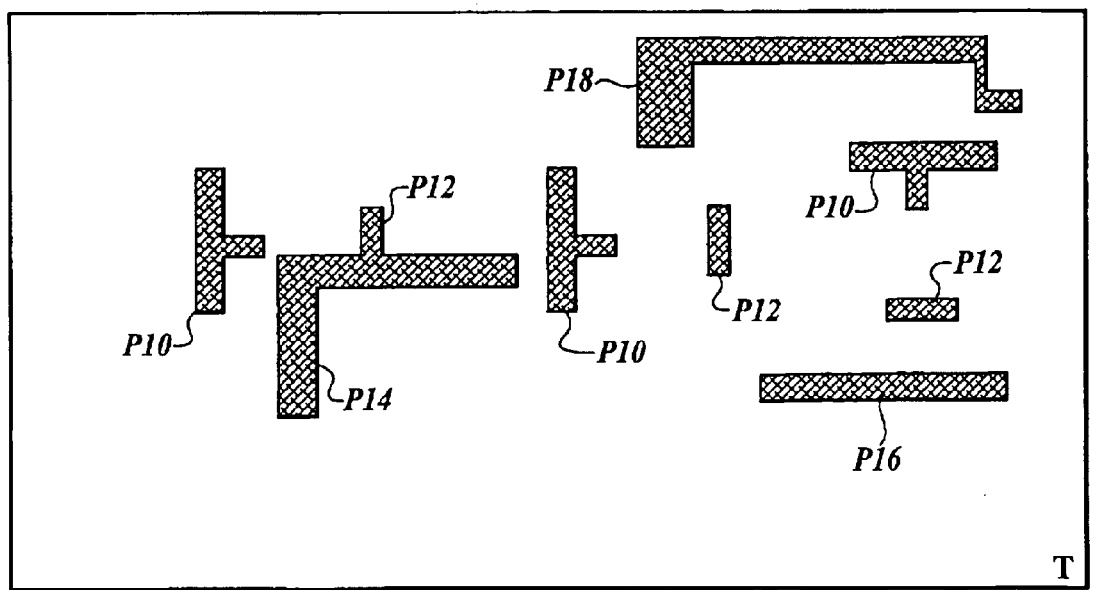
FIG. 4 illustrates the IC layout shown in FIG. 3A after it has been "flattened"

FIG. 4 illustrates the top cell 50 if each of the remaining cells A, B, and C is flattened into a single data layer. The top cell 50 includes each instance of the polygons P10, P12, P14, P16, and P18 contained in each of the previously described cells.

FIG. 5 illustrates the cells for the layout of FIG. 3 as modified by an embodiment of the invention. Each polygon originally in the layout of FIG. 3 has a corresponding structure among the modified cells M56, M54, and M64, but additional polygons have been created to account for the overlap of cells when combined to write the mask. This will be described in more detail below.

To reduce the amount of IC layout data that is transmitted to a mask writing tool, the present invention selects certain cells and transmits fewer descriptions of a selected cell than the number of times the cell appears in the IC layout. Instead, a jobdeck simply specifies the placement of the repeated cells. As used herein, the term "repeated cell" refers to a cell that has a pattern of polygons that is repeated two or more times throughout the IC layout. In FIG. 3A, cell A is a repeated cell.

To write the mask, a repeated cell is loaded onto the mask writing tool, and written at various locations according to the jobdeck. This is typically done by making a coarse adjustment to the mask writing tool stage to set the overall position, then the fine patterns are written with local exposure control. Each time the stage of the mask writing tool is moved, there is some settling time. Therefore, if the selected cells are too small, the time required to write all the placements of the cells on the mask increases. On the other hand, if the area of selected cell is too large, then the time to transfer its description to the mask writing tool is too long. Finally, the area occupied by the selected cells on the mask should be maximized. It is against these competing criteria that cells of the IC layout are selected.

The set of cells that best meets these criteria may be optimally selected by considering every set of cells of every possible size. This method may be computationally time-consuming. Approximation methods may therefore be used that select a suboptimal set. In practice these approximate methods work very well, often as well as the optimal method, and with much less computation.

One such approximate method of selecting cells is to evaluate each cell in accordance with a cost function. In an actual embodiment of the invention, the cost function is set forth in Equation 1:

$$Mi = K \cdot \frac{Ci}{\text{area left}} + \exp\left(\left|\frac{\frac{Ai}{\text{chiparea}} - M}{S}\right|\right) \qquad (1)$$

where "Mi" is the cost function result of a given cell, "Ci" is the coverage for the cell, i.e., the total area occupied by all instances of the cell within the integrated circuit. The term "chip area" refers to the total area of the integrated circuit. The term "area left" is the chip area less the area occupied by any previously selected cells. The term "Ai" is the area of an individual instance of the cell under consideration. Cell area may be measured as simply the size of the rectangular extent of the cell. A more accurate measurement reflects the area of the cell not overlapped by other cell placements in any of its placements ("template-specific area"), and the geometrical complexity of the data within that area. The term "M" represents an ideal cell area, which, in one embodiment of the invention, is about 1/250 of the area of the integrated circuit and the term "S" characterizes the useful range of cell area values around M.

Each cell in the IC layout is given a score for the cost function and the highest scoring cells are chosen as the selected cells.

The following is a pseudo-code listing of a computer program that implements the selection of cells (referred to as cover cells in the pseudo-code) according to the cost function set forth in Equation 1.

```
Inputs:
-------
hierarchical database      Contains geometry, overlap areas, and the hierarchy.
Algorithm:
----------
// First, allocate storage space for various values for each cell.
AllocateArray a[];         // Template specific area for each cell.
AllocateArray n[];         // Number of flat placements of each cell.
AllocateArray c[];         // "Coverage" for each cell.
// Compute initial values for a[] and c[].
for each (cell in database) {
    a[i] = EXTENT(cell) – OVERLAP_AREA(cell); // The template-specific area.
    n[i] = number of flat placements of cell (from database);
    c[i] = n[i] * tsArea;
}
// Next, cover the chip area with placements of individually selected cells.
// After each cell is selected, update the area and placement count records
// for all remaining (not yet selected) cells.
stop = false;
areaLeft = total chip area;
coverCells = {};
while (stop == false) {
    maxScore = 0;
    maxCell = 0;
    nTotal = 0;
    NL = 4; NU = 300; // Empirically chosen constants.
// The cell mark is a general purpose database flag.
    for each (cell in database) {
        if (NL <= n[cell] <= NU) clear cell mark;
        else set cell mark;
    }
    for each (unmarked cell in database) {
```

-continued

```
            m = Score(c[cell], a[cell], areaLeft);
            if (m > maxScore) {
                maxScore = m;
                maxCell = cell;
            }
        }
        coverCells = coverCells UNION {maxCell};
        nTotal = nTotal + n[cell];
        areaLeft = areaLeft - c[cell];
        UpdateCoverage(c, a, maxCell, database);
        stop = UpdateStop(areaLeft, nTotal, maxCell);
    }
    // The coverage score function.
    Score (ci, ai, areaLeft) {
        // Empirically chosen constants.
        K = 2;
        M = 0.004;
        S = 0.01;
        return (K * (ci/areaLeft) + exp {-(|ai/chipArea- M|) /S};
    }
    // The stopping condition update function.
    UpdateStop (areaLeft, n, maxCell) {
        // Empirically chosen constants.
        MAX_COVER = 40;
        MAX_PLACEMENTS = 400;
        AREA_LEFT = 0.05
        // Stop if the number of selected cells is too large, the number
        // of total placements is too large, or enough area has been covered.
        return true if ((|coverCells| > MAX_COVER) OR
                (nTotal > MAX_PLACEMENTS) OR
                (areaLeft/chipArea < AREA_LEFT));
        else return false;
    }
    // The coverage update function.
    UpdateCoverage (c, a, coverCell, database) {
        // First, mark cells that contain the chosen cover cell.
        // Disqualify these cells as future cover cells.
        // "Previous" means previous in the topological sort sense.
        // Alternatively, one could modify a[i] to account for
        // placements of the cover cell, but that is less efficient.
        mark (coverCell);
        for (currentCell = coverCell->previous; currentCell != TOPCELL;
                currentCell = coverCell->previous) {
            if (any placement of currentCell is marked) mark(currentCell);
        }
        // Now reduce coverage for cells that have placements in the
        // cover cell.
        // "Next" means next in the topological sort sense.
        AllocateArray nn[]; // Number of placements of each cell in the cover cell.
        initialize nn[] to zero;
        for (currentCell = coverCell->next; currentCell != BOTTOM;
                currentCell = currentCell->next) {
            for each (placement in currentCell) {
                nn[placement's cell] += nn[currentCell];
            }
        }
        for each (cell in database) {
            c[cell] -= nn[cell] * n[coverCell];
        }
    }
}
```

Although any cell is suitable for consideration as a selected cell, performance enhancements can be made by only considering cells that are repeated more than some minimum number of times in the layout and less than a maximum number of times in the layout. In one embodiment, the minimum number of times a cell must be repeated to be considered is 4 and the maximum number of times a cell can be repeated is several hundred.

Although one embodiment of the invention utilizes the cost function described above, it will be appreciated that there are other ways to select cells. For example, cells could be selected based on size alone, such as any cell having 1/200th area of the integrated circuit could be used. Alternatively, density of a cell could be used. Cells having a greater density of polygons take more time to transmit, so redundant cells having a relatively large area and high density could be selected. Manual selection could also be used.

In the example shown in FIG. 3A, the cells A and C are selected. Cell C is a selected cell for the purposes of illustrating aspects of the present invention even though it is not a repeated cell in the IC layout.

Next, the selected cells are modified to compensate for other cells that interact with the selected cells. In the one embodiment of the invention, the interaction of cells with selected cells is limited to the addition of polygons or portions of polygons from non-selected cells, which overlap a selected cell. However, other types of interaction may also be compensated, such as optical interference or etch microloading.

Figure 5A:
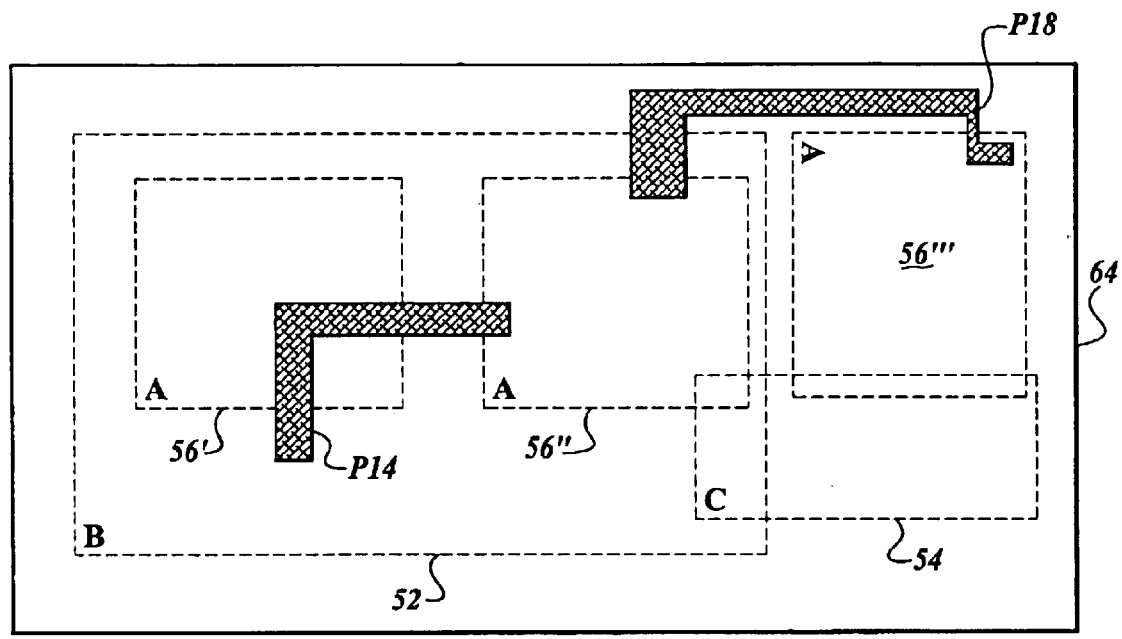
FIGS. 5A–5D illustrate a number of modified cells and a remainder cell for use in creating a photolithographic mask in accordance with one embodiment of the present invention.
Figure 5B:
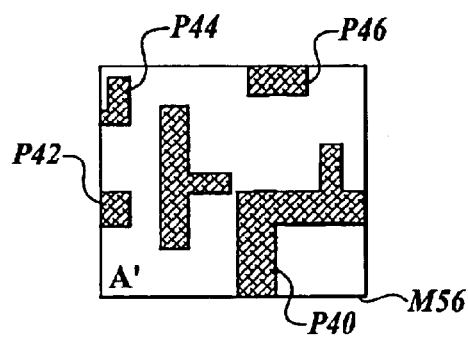

As can be seen in FIG. 3A, the B cell 52 includes a polygon P14 having a portion of which overlaps the instance 56' of the A cell. Therefore, a modified A cell M56, as shown in FIG. 5B, is created having a polygon P40 that represents the overlapping portion of the polygon P14 and the instance 56' of the selected cell A. Similarly, a portion of the polygon P14 overlaps a portion of the instance 56" of the selected cell A. Therefore, a polygon P42 is added to the modified cell M56 that represents the overlapping region of the polygon P14 and the instance 56" of selected cell A. Finally, in the example shown, the top cell 50 has a polygon P18 having a portion that overlaps a portion of the instance 56" of the selected cell A and the instance 56'" of selected cell A. Therefore, a polygon P46 is added to the modified cell M56 that represents the area of overlap of the polygon P18 and the cell 56" as well as a polygon P44 that represents the overlap of the polygon P18 with the cell 56'". It should be noted that the additional polygons added to the modified cell M56 are placed at the same relative location where they overlap the corresponding instances of the selected cell in the IC layout.

Figure 5C:
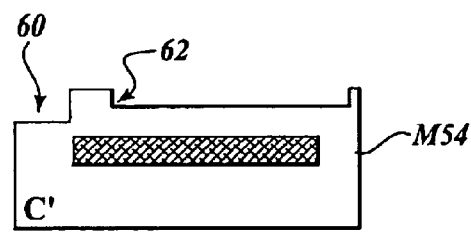

Although the present embodiment of the invention limits the modification of cells to the addition of polygons from overlapping cells, in some instances it may be desirable to compensate for other interactions, such as cells having "extents" or areas that overlap but have no overlapping polygons. For example, as shown in FIG. 3A, the extent of selected cell C 54 overlaps the instances 56" and the 56'" of cell A. Therefore, a modified cell M54 as shown in FIG. 5C can be created having cutaway areas 60, 62 that remove the areas that overlap with the other cells in the IC layout.

Once the selected cells have been modified to compensate for the interactions of other cells, one or more additional or remainder cells is created. As shown in FIG. 5A, the purpose of the one or more remainder cells 64 is to create structures on the mask that would not be created by the writing of the selected cells A and C. In FIG. 5A, the remainder cell includes polygons P14 and P18 to create structures not created by the selected cells A and C.

Figure 5D:
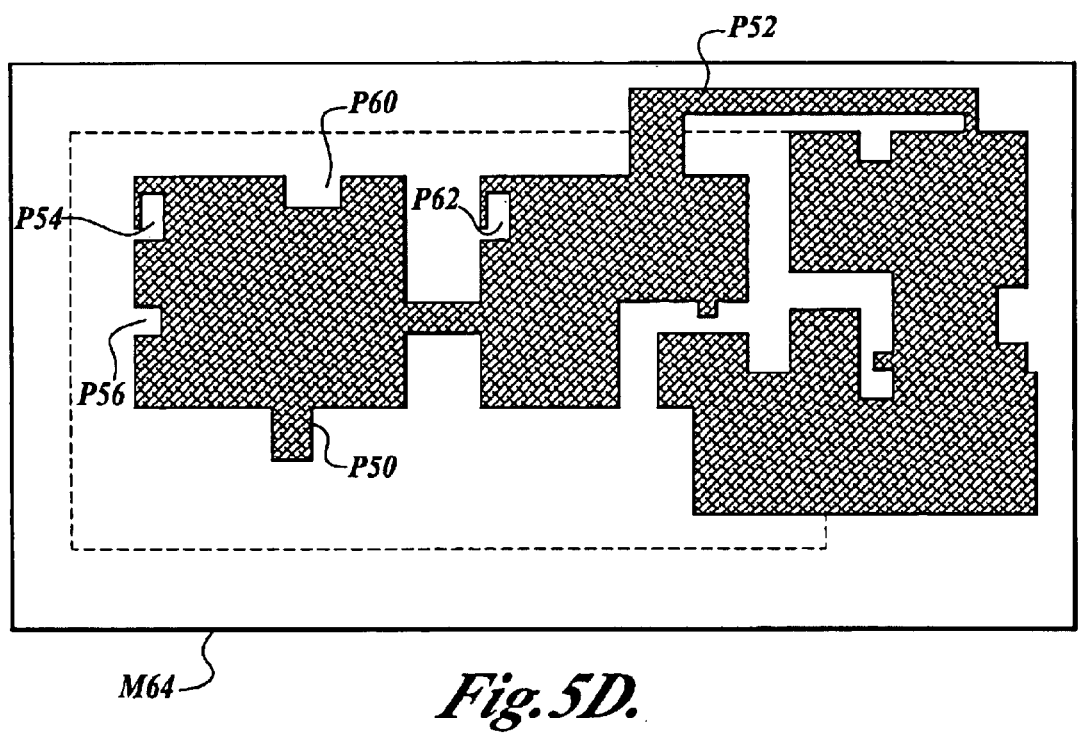

Because each of the selected cells may have been modified to compensate for interactions with other cells in the IC layout, the one or more additional or remainder cells are typically modified to prevent the formation of extraneous structures on the mask. As shown in FIG. 5D, a modified remainder cell M64 is shown. The modified remainder has polygons that will create structures on the mask that are not created by the writing of the selected cells as well as areas that will prevent the creation of extraneous structures that would be created by the writing of the modified cells on the mask.

As can be seen by viewing the modified remainder cell M64 in FIG. 5D, cell M64 generally includes large blocks that cover the regions in which the selected cells are written. In addition, the modified remainder cell M64 has a number of clear areas that prevent the formation of structures caused by the writing of the modified cells. For example, the modified remainder cell M64 includes an area P56 that prevents the formation of a structure on the mask that would be caused by writing the polygon P42 in the modified cell A M56 (FIG. 5B) at certain locations on the mask. Similarly, the modified cell M64 includes a region P54 that prevents the formation of structure on the mask that would caused by writing the polygon P44 in the modified cell M56 at certain locations on the mask.

Although the areas P56, P54, P60, P62, etc., are shown as clear areas, it will be appreciated that the modified remainder cell could be inverted such that the modified cell includes blocked areas where it is desired to prevent the formation of a feature on the mask and open areas where it is desired to produce a structure.

The following is a pseudo-code listing of the software command that create the modified cells and the one or more remainder cells using the Calibre™ program described above. However, it will be appreciated that many other computer programs could be written to implement the logic of the present invention.

```
Inputs:
-------
geometryLayer  original hierarchical geometry set
coverCells     list of cover cells.
transforms     lists of required transforms, one for each cover cell
Algorithm:
----------
AllocateLayer(blockLayer);  // A temporary container ("layer") for hierarchical
                            // geometry storage.
// Modify and fracture each cover cell, and accumulate the hierarchical block layer.
for each (coverCell) {
        // Accumulate the blocking geometry in the hierarchical set "blockLayer".
    // Definitions:
    // EXTENT: Smallest rectangle that covers all cell contents.
    // OVERLAP_AREA: Area in a cell that is overlapped by placements of cells
anywhere
        in the hierarchy
    // HIER_OR: A hierarchical OR operation, as found in any DRC tool.
        blockRegion1 = EXTENT(coverCell) NOT OVERLAP_AREA(coverCell);
        blockRegion2 = GEOMETRY(coverCell and descendants) AND
        OVERLAP_AREA(coverCell);
        blockRegion = blockRegion1 OR blockRegion2
        add (blockRegion) to (blockLayer);
        // Do a hierarchical OR operation to get the total fracture data for this cell.
        AllocateLayer(fractureLayer);
        fractureLayer = OVERLAP_AREA(coverCell) HIER_OR geometryLayer;
        for each (transform) {  // Fracture cell once per required transform.
            Fracture(fractureLayer, coverCell, transform);
        }
```

-continued

```
}
// Compute and fracture the remainder set.
AllocateLayer(remainderLayer);
remainderLayer = blockLayer HIER_OR geometryLayer;
Fracture(remainderLayer, topCell, identityTransform);
```

The selection of cells for modification and the creation of the modified cells and the remainder cells can also be improved by running the computations using parallel processing, either with a computer with multiple processors (i.e., multithreading) or using a network of computers (distributed processing).

To produce the mask, a jobdeck file is created that describes the structure location and orientation of the selected, modified cells, as well as provides certain mask writing tool control parameters (such as address unit, beam and dose parameters, etc.) to be used with each file specified by the jobdeck. In addition, the jobdeck includes a description of the location and orientation of the one or more of modified remainder cells that are typically written over the entire area of the layout, along with the appropriate mask writing tool control parameters. The information in the jobdeck is then transmitted to the mask writing tool and the mask writing tool then writes the selected, modified cells at the locations indicated. In addition, the mask writing tool writes the one or more modified remainder cells. The order in which the cells are written is unimportant. For example, the one or more modified remainder cells may be written first, followed by writing the modified selected cells or vice versa.

In some instances, the orientation of the modified cells varies in the IC layout data. For example, as shown in FIG. 3A, the instances 56' and 56''' of cell A are the same with the exception that the cell 56''' is rotated 90° clockwise with respect to the cell 56'. If the mask writing tool is sophisticated, then the jobdeck can contain a description of the modified cell that corresponds to the cell 56' and an indication of where the modified cell should be written on the mask with an instruction to rotate the modified cell by 90° in order to write a cell that corresponds to the rotated cell 56'''. However, some mask writing tools are only capable of limited transformations. Therefore, prior to creating the jobdeck, the computer may need to determine what transformations the mask writing tool is capable of making and create a new modified cell that the mask writing tool is capable of writing directly or transforming in order to write in a way that corresponds to the orientation of the selected cell at a particular position on the IC mask.

By only transmitting the descriptions of the modified cells and the one or more modified remainder cells as well as a jobdeck specifying where and how these should be written, the amount of data that must be transmitted to the mask writing tool can be significantly reduced. By transmitting less data, the time required for the mask writing tool to receive the data is significantly reduced and the chance that an error will occur during transmission is likewise similarly reduced. The mask writing tool achieves a better utilization when the time it takes to transfer data to the writer is the same or less than the time it takes the mask writing tool to expose that data on the mask.

While the preferred embodiment of the invention has been illustrated and described, it will be appreciated that various changes can be made therein without departing from the spirit and scope of the invention. For example, one may provide for imperfect overlay alignment of the mask writing machine. If the machine is unable to exactly line up the modified selected cells with the one or more modified remainder cells, gaps may appear where the remainder geometry abuts geometry in the selected cells. This may be avoided by identifying such abutting edges in the remainder cell, and expanding them slightly towards the abutting geometry in the selected cell. Or, a different cost function could be utilized based on, for example, the density of the data contained in a cell or a fixed cell area threshold. The scope of the invention is therefore to be determined from the following claims and equivalents thereto.

The embodiments of the invention in which an exclusive property or privilege is claimed are defined as follows:

1. A method of creating a file that describes a layer of an integrated circuit for use by a mask writing tool, comprising:
    receiving a hierarchical input file that defines a number of cells, each of which defines one or more polygons corresponding to patterns to be created on a mask, and may include references to other cells;
    selecting one or more cells from the hierarchical input file;
    modifying the selected cells to include the polygons or portions thereof found in overlapping placements of the non-selected cells and the placements of the selected cells;
    creating one or more remainder cells to include polygons or portions thereof defined in the placements of non-selected cells that are not within the modified, selected cells; and
    creating a file for use by a mask writing tool by eliminating the non-selected cells such that the description of the modified, selected cells and the one or more remainder cells with their placements describe the layer of the integrated circuit.

2. The method of claim 1, wherein each cell has an extent, and the extents of at least some of the modified, selected cells are written on the mask overlap.

3. The method of claim 1, wherein the step of creating one or more remainder cells includes creating a cell with polygons that prevent extraneous patterns from being created on a mask when the modified selected cells are written on the mask.

4. The method of claim 1, wherein the selection of cells is limited to cells that are repeated in the layer of the integrated circuit.

5. The method of claim 1, further comprising: determining an area of a mask that would be occupied by each cell and the time required to write the placements of a cell on a mask, wherein the selection of cells is limited to cells that maximize the area of the mask written with the modified, selected cells and minimizes the time required to write the modified, selected cells on the mask.

6. The method of claim 1, wherein the selected cells are modified by determining if the mask writer transforms the orientation of a modified, selected cell and if not, creating a copy of the modified, selected cell that the mask writer prints in a proper orientation.

7. A computer readable media including a number of instructions that when executed by a computer cause the computer to perform a method for creating a file that describes a layer of an integrated circuit for use by a mask writing tool by:

receiving a hierarchical input file that defines a number of cells, each of which defines one or more polygons corresponding to patterns to be created on a mask, and includes references to other cells;

selecting one or more cells from the hierarchical input file;

modifying the selected cells to include the polygons or portions thereof found in overlapping placements of the non-selected cells and the placements of the selected cells;

creating one or more remainder cells to include polygons or portions thereof defined in the placements of non-selected cells that are not within the modified selected cells; and creating a file for use by a mask writing tool by eliminating the non-selected cells such that the description of the modified, selected cells and the one or more remainder cells with their placements describe the layer of the integrated circuit.

8. The computer readable media of claim 7, wherein the instructions further cause the computer to create one or more remainder cells by creating a cell with polygons that prevent extraneous patterns from being created on a mask when the modified, selected cells are written on the mask.

9. The computer readable media of claim 8, wherein the instructions further cause the computer to determine an area of a mask that would be occupied by each cell and the time required to write the placements of a cell on a mask and to limit the selection of cells to cells that maximize the area of a mask written with the modified, selected cells and minimizes the time required to write the modified, selected cells on the mask.

10. The computer readable media of claim 8, wherein the instructions further cause the computer to modify the selected cells by determining if the mask writer transforms the orientation of a modified, selected cell and if not, creating a copy of the modified, selected cell that the mask writer prints in a proper orientation.

11. The computer readable media of claim 7, wherein the instructions further cause the computer to limit the selection to cells that are repeated in the layer of the integrated circuit.

12. A method of preparing a file that describes a layer of an integrated circuit to be used by a mask writer to create one or more masks, comprising:

receiving a hierarchical input data file that defines a number of cells, each of which defines one or more polygons corresponding to patterns to be created on a mask, a placement of where the cell is to be printed, and includes references to other cells;

reducing the hierarchy of the input data file by:

selecting a number of cells;

modifying the selected cells by incorporating polygons or portions thereof defined in non-selected cells having extents that overlap, the extents of the selected cells; and creating one or more remainder cells, including polygons or portions thereof that are not defined in the modified, selected cells; and creating the file for use by the mask writer that describes the layer of the integrated circuit by including the selected cells and the one or more remainder cells, and their placements.

13. A computer readable media including a number of instructions that when executed by a computer cause the computer to perform a method of preparing a file that describes a layer of an integrated circuit to be used by a mask writer to create one or more masks by:

receiving a hierarchical input data file that defines a number of cells, each of which defines one or more polygons corresponding to patterns to be created on a mask, a placement of where the cell is to be printed, and includes references to other cells;

reducing the hierarchy of the input data file to include a number of selected cells that include polygons or portions thereof defined in non-selected cells having placements that overlap placements of the selected cells, and one or more remainder cells having polygons or portions thereof not defined in the selected cells; and creating the file for use by the mask writer that describes the layer of the integrated circuit by including selected cells, the one or more remainder cells and their placements.

14. A file that describes a layer on an integrated circuit for use by a mask writer to create one or more masks, wherein the file is created by:

receiving a hierarchical input file that defines a number of cells, each of which defines one or more polygons corresponding to patterns to be created on a mask, an indication of where the cells should be placed, and includes references to other cells;

selecting one or more cells from the hierarchical input file;

modifying the selected cells to include the polygons or portions thereof found in overlapping placements of the non-selected cells and the placements of the selected cells;

creating one or more remainder cells to include polygons or portions thereof defined in the placements of non-selected cells that are not within the modified, selected cells; and creating a file for use by a mask writing tool by eliminating the non-selected cells such that the description of the modified, selected cells and the one or more remainder cells with their placements describe the layer of the integrated circuit.

15. A file that describes a layer of an integrated circuit for use by a mask writer to create one or more masks that is created by:

receiving a hierarchical input data file that defines a number of cells, each of which defines one or more polygons corresponding to patterns to be created on a mask, an indication of where the cells should be placed, and includes references to other cells;

reducing the hierarchy of the input data file to include only a number of selected cells that define a number of polygons and polygons or portions thereof that are defined in non-selected cells having placements that overlap the placements of the selected cells and one or more remainder cells that define polygons or portions thereof that are not defined in the selected cells; and creating the file for use by the mask writer that describes the layer of the integrated circuit by including the selected cells and the one or more remainder cells and their placements.

* * * * *